US009888560B2

(12) United States Patent
Ao et al.

(10) Patent No.: US 9,888,560 B2
(45) Date of Patent: Feb. 6, 2018

(54) DIFFERENTIAL TRANSMISSION LINE HAVING QUARTER WAVELENGTH DIFFERENTIAL COUPLER TO REDUCE COMMON MODE NOISE

(71) Applicant: Lenovo Enterprise Solutions (Singapore) PTE. LTD., New Tech Park (SG)

(72) Inventors: Rong Eric Ao, Morrisville, NC (US); Alexander Philip Campbell, Morrisville, NC (US); Donald Richard Dignam, Morrisville, NC (US); Stephen John Flint, Morrisville, NC (US); Jian Meng, Ottawa (CA)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 145 days.

(21) Appl. No.: 14/670,770

(22) Filed: Mar. 27, 2015

(65) Prior Publication Data
US 2016/0285148 A1   Sep. 29, 2016

(51) Int. Cl.
*H05K 1/02* (2006.01)
*H01P 3/02* (2006.01)
*H01P 5/02* (2006.01)

(52) U.S. Cl.
CPC ............ *H05K 1/0216* (2013.01); *H01P 3/02* (2013.01); *H01P 3/026* (2013.01); *H01P 5/028* (2013.01); *H05K 1/0245* (2013.01)

(58) Field of Classification Search
CPC ........ H03H 1/0007; H03H 7/427; H03H 7/00; H01P 3/02; H01P 3/026; H01P 5/028; H05K 1/0216; H05K 1/0245

USPC .................. 333/4, 12, 181, 185, 202, 204
See application file for complete search history.

(56) References Cited

U.S. PATENT DOCUMENTS

| 7,403,080 | B2* | 7/2008 | Kanno ............... H01P 1/201 333/246 |
| 7,956,704 | B1* | 6/2011 | Acimovic ........... H01P 1/203 333/181 |
| 2012/0194291 | A1 | 8/2012 | Pajovic | |

OTHER PUBLICATIONS

Wu, et al. "Novel Balanced Coupled-Line Bandpass Filters With Common-Mode Noise Suppression", IEEE Transactions on Microwave Theory and Techniques, vol. 55, No. 2, Feb. 2007, pp. 287-294.*

(Continued)

*Primary Examiner* — Benny Lee
*Assistant Examiner* — Hafizur Rahman
(74) *Attorney, Agent, or Firm* — Jason Friday

(57) ABSTRACT

A differential transmission line includes a positive conductor on which a positive complementary component of a differential signal is transmitted, and a negative conductor parallel to the positive conductor on which a negative complementary component of the differential signal is transmitted. A quarter wavelength differential coupler is inserted along a length of the positive and negative conductors. The quarter wavelength differential coupler has a length corresponding to a frequency of common mode noise on the positive and negative conductors. The quarter wavelength differential coupler reduces the common mode noise at the frequency as the differential signal passes through the quarter wavelength differential coupler.

15 Claims, 3 Drawing Sheets

(56) References Cited

OTHER PUBLICATIONS

Shiue, et al. "A Comprehensive Investigation of a Common-Mode Filter for Gigahertz Differential Signals Using Quarter-Wavelength Resonators", IEEE Transactions on Components, Packaging and Manufacturing Technology, vol. 4, No. 1, Jan. 2014, pp. 134-144.*

* cited by examiner

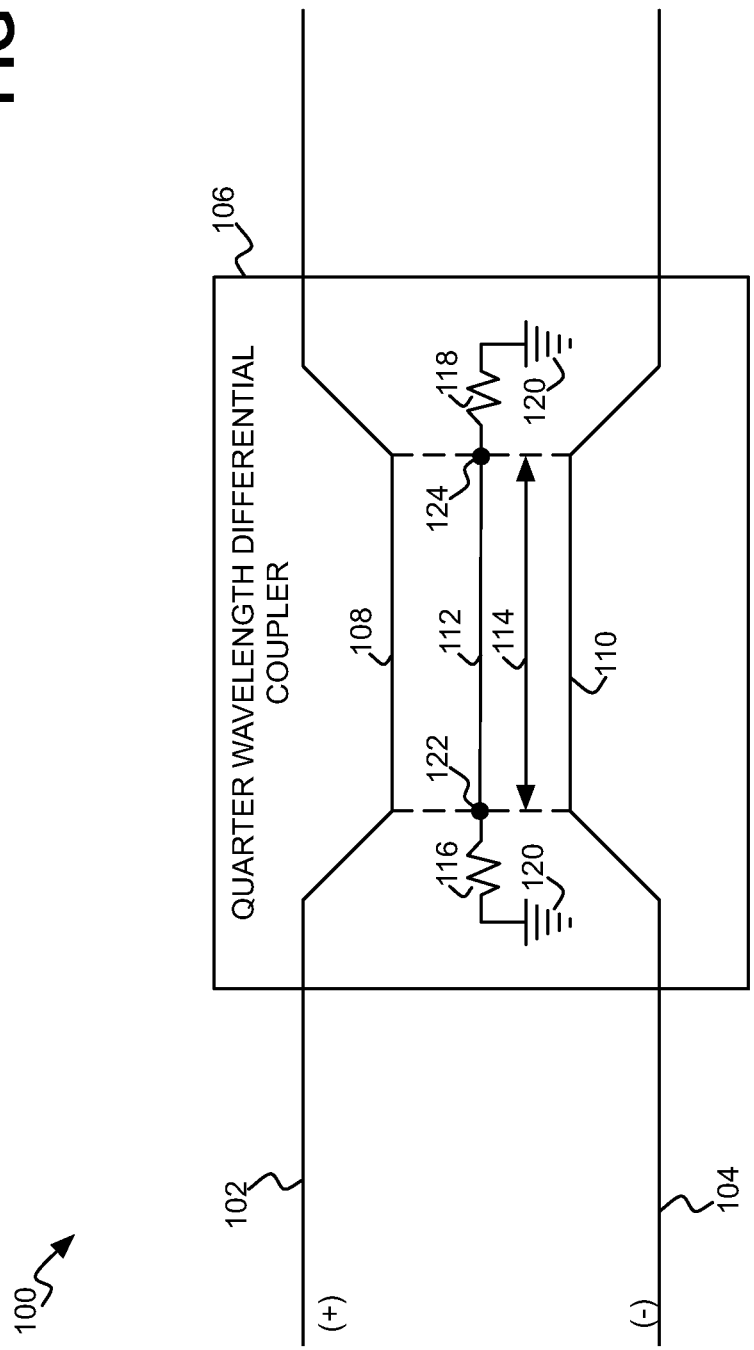

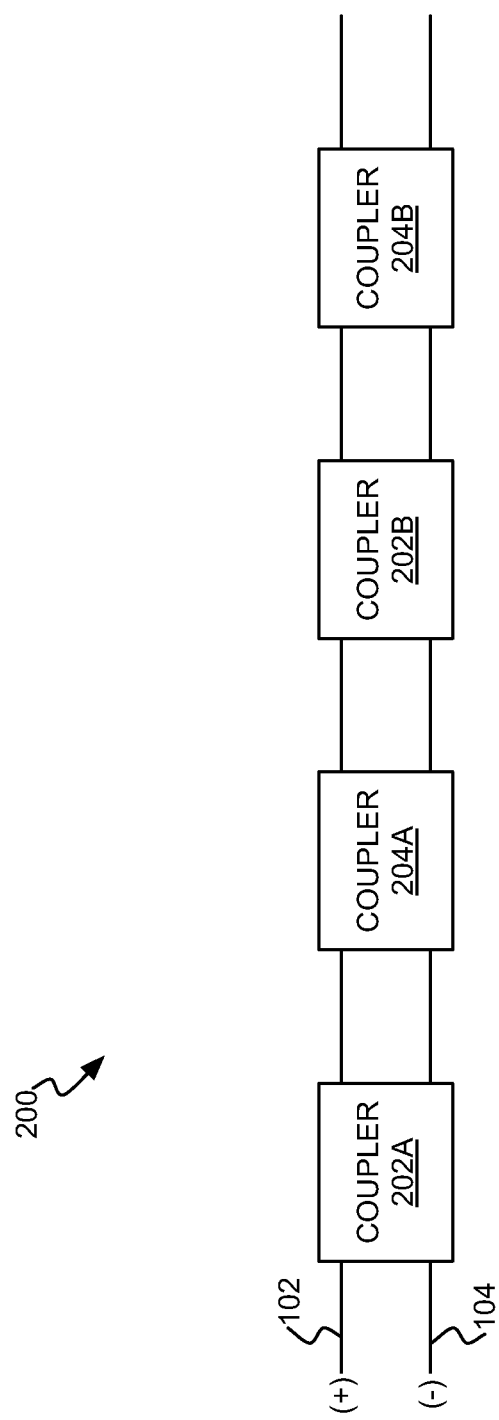

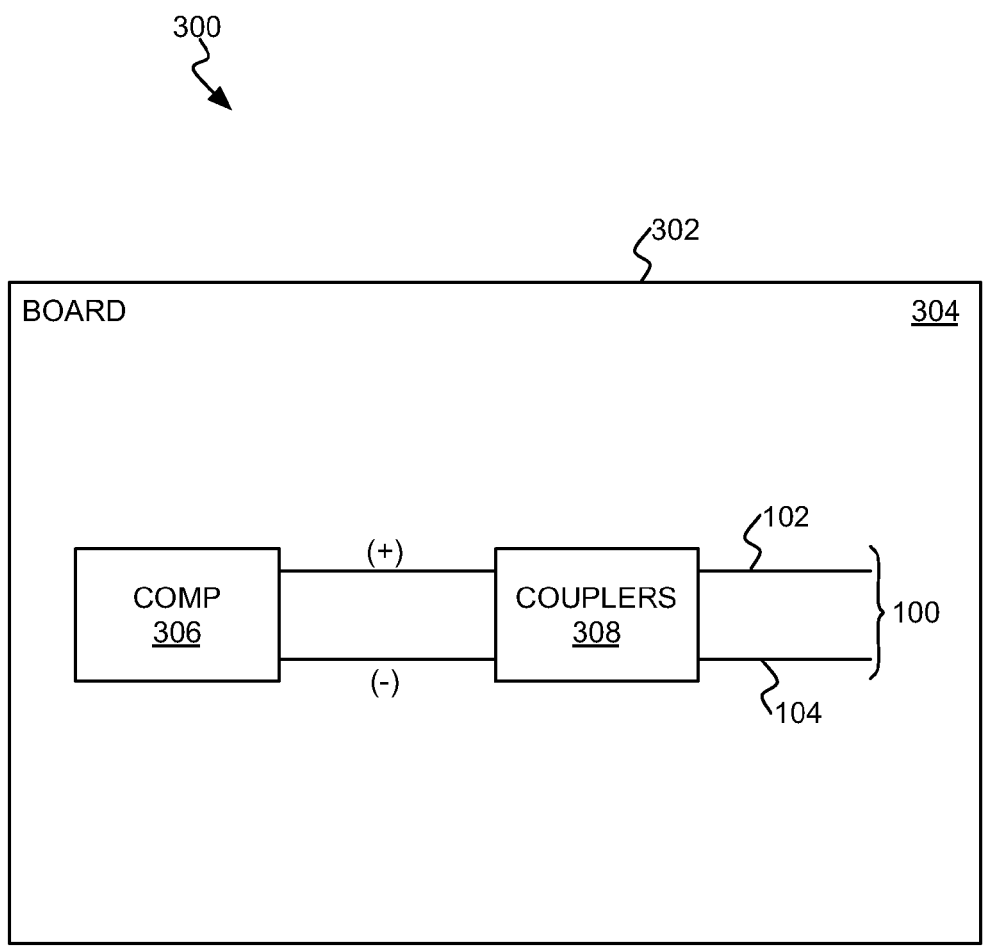

DIFFERENTIAL TRANSMISSION LINE HAVING QUARTER WAVELENGTH DIFFERENTIAL COUPLER TO REDUCE COMMON MODE NOISE

TECHNICAL FIELD

The present invention relates generally to differential transmission lines, and more particularly to reducing common mode noise on such differential transmission lines.

BACKGROUND

Differential signaling is a way to transmit information electrically with two complementary signals sent over two paired conductors, which are referred to as a differential pair. External interference, such as noise from electromagnetic interference (EMI) sources, tends to affect both conductors, and information is sent as the difference between the two conductors. Therefore, differential signaling improves resistance to electromagnetic noise as compared with using just one conductor and an unpaired reference, such as ground.

SUMMARY

An example differential transmission line includes a positive conductor on which a positive complementary component of a differential signal is transmitted, and a negative conductor parallel to the positive conductor on which a negative complementary component of the differential signal is transmitted. The differential transmission line includes a quarter wavelength differential coupler inserted along a length of the positive and negative conductors. The quarter wavelength differential coupler has a length corresponding to a frequency of common mode noise on the positive and negative conductors. The quarter wavelength differential coupler reduces the common mode noise at the frequency as the differential signal passes through the quarter wavelength differential coupler.

An example circuit board includes a substrate and a differential transmission line on or within the substrate. The circuit board includes a quarter wavelength differential coupler inserted along a length of the differential transmission line to reduce common mode noise as a differential signal is transmitted on the differential transmission line and passes through the quarter wavelength differential coupler.

An example electronic device includes a circuit board, and one or more electrical components mounted on or within the circuit board. The electronic device includes a differential transmission line formed on or within the circuit board to transmit a differential signal. The electronic device includes quarter wavelength differential couplers. Each quarter wavelength differential coupler is inserted at a different location along a length of the differential transmission line. The quarter wavelength differential couplers additively reduce common mode noise at a selected frequency as the differential signal is transmitted on the differential transmission line and passes through each quarter wavelength differential coupler.

BRIEF DESCRIPTION OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIG. 1 is a diagram of an example differential transmission line having a quarter wavelength differential coupler to reduce common mode noise.

FIG. 2 is a diagram of another example differential transmission line having multiple quarter wavelength differential couplers for each of multiple frequencies at which common mode noise is to be reduced.

FIG. 3 is a diagram of an example electronic device having one or more electrical components and a circuit board with a differential transmission line having a quarter wavelength differential coupler to reduce common mode noise.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure.

As noted in the background section, differential signaling employs a differential pair of conductors to improve resistance to electromagnetic noise, which is also known as the common mode signal. By comparison, the differential mode signal is the information conveyed as the difference between the conductors. However, in practice, high frequency alternating current (AC) components within the common mode signal cause electromagnetic radiation that result in noise even when employing differential signals. For example, an imbalance between the signals on the two conductors, which can result from the signals being imperfect, can cause common mode noise that results in electromagnetic interference (EMI) emissions.

Techniques disclosed herein further reduce such common mode noise within differential signaling, via employing a quarter wavelength differential coupler. The transmission line includes positive and negative conductors on which positive and negative complementary components, respectively, of a differential signal are transmitted. A quarter wavelength differential couple is inserted along a length of the positive and negative conductors, and has a length corresponding to a quarter of the wavelength of the common mode noise on the conductors.

In common mode, the quarter wavelength differential coupler injects an insertion loss to the common mode signal on the positive and negative conductors. By comparison, in differential mode, the quarter wavelength differential coupler does not inject an insertion loss to the differential signal on the positive and negative conductors. As such, the quarter wavelength differential coupler reduces common mode noise as the differential signal passes through the coupler, while minimally affecting the differential signal. The common mode signal (i.e., the common mode noise) at the wavelength in question can be better suppressed.

FIG. 1 shows an example differential transmission line 100 that includes a quarter wavelength differential coupler 106 to reduce common mode noise. The transmission line 100 includes a positive conductor 102 and a negative conductor 104. A positive complementary component of a differential signal is transmitted on the positive conductor 102, and a negative complementary component of the differential signal is transmitted on the negative conductor 104. The terminology "positive" and "negative" in relation to the conductors 102 and 104 is used to distinguish the conductor 102 on which the positive complementary component is transmitted from the conductor 104 on which the negative complementary component is transmitted. The differential signal can be transmitted from left to right in the example of FIG. 1.

The quarter wavelength differential coupler 106 is inserted along a length of the positive and negative conductors 102 and 104. The quarter wavelength differential coupler 106 can also be referred to as a stripline or a microstrip. The quarter wavelength differential coupler 106 includes a positive main line 108 in electrical series with the positive conductor 102, and a negative main line 110 in electrical series with the negative conductor 104. The quarter wavelength differential coupler 106 further includes a coupled line 112 between (i.e., at a mid-point of) and physically parallel to the positive and negative main lines 108 and 110. The coupled line 112 extends between a coupled port 122 and an isolated port 124.

The quarter wavelength differential coupler 106 has a length 114. The length 114 corresponds to the frequency of the common mode noise to be reduced on the positive and negative conductors 102 and 104. That is, the length 114 can be equal to a quarter of the wavelength of the common mode noise (i.e., the wavelength divided by four). The quarter wavelength differential coupler 106 has resistors 116 and 118 that connect opposite ends of the coupled lined 112 to ground 120, such as electrical or earth ground. Specifically, the resistor 116 is connected to the coupled port 122, and the resistor 118 is connected to the isolated port 124. The resistors 116 and 118 have the same resistance, such as nominally fifty ohms in one implementation.

In differential mode, the positive complementary component of the differential signal on the positive conductor 102 and the negative complementary component of the differential signal on the negative conductor 104 are 180 degrees out of phase. Therefore, there is no coupled output power at either the coupled port 122 or the isolated port 124 of the quarter wavelength differential coupler 106. As such, the quarter wavelength differential coupler 106 does not inject an insertion loss to the differential signal on the positive and negative conductors 102 and 104. Stated another way, the differential signal passes through the quarter wavelength differential coupler 106; the coupler 106 minimally affects the differential signal.

By comparison, in common mode, the common mode signal is the same on both the positive and negative conductors 102 and 104 and thus is in phase on the conductors 102 and 104. Therefore, there is coupled output power at the coupled port 122 but not at the isolated port 124 of the quarter wavelength differential coupler 106. This means that the quarter wavelength differential coupler 106 injects an insertion loss to the common mode signal (corresponding to common mode noise) on the positive and negative conductors 102 and 104. Stated another way, the quarter wavelength differential coupler reduces common mode noise as the differential signal passes through the quarter wavelength differential coupler 106.

The resistors 116 and 118 can be removable and re-insertable. Removal of the resistors 116 and 118 renders the quarter wavelength differential coupler 106 inoperable in reducing common mode noise as the differential signal passes through the coupler 106. Subsequent insertion of the resistors 116 and 118 again renders the quarter wavelength coupler 106 operable in reducing common mode noise as the differential signal passes through the coupler 106. This is advantageous, insofar as multiple quarter wavelength differential couplers 106 can be inserted along differential transmission line 100, and selective resistors 116 and 118 thereof removed to achieve the desired reduction in common mode noise. Furthermore, different quarter wavelength differential couplers 106 can have different lengths 114 to reduce the common mode noise at corresponding different frequencies. Both of these aspects are now described in detail.

FIG. 2 shows another example of a differential transmission line 200. The differential transmission line 200 includes the positive conductor 102 and the negative conductor 104 as before. Multiple quarter wavelength differential couplers 202A and 202B, collectively referred to as the quarter wavelength differential couplers 202, and multiple quarter wavelength differential couplers 204A and 204B, collectively referred to as the quarter wavelength differential couplers 204, are inserted in electrical series within the transmission line 104 at different locations along the length of the line 104. Two quarter wavelength couplers 202 and two quarter wavelength couplers 204 are depicted in FIG. 2, but there can be any number, such as one or more than two, of the couplers 202 and of the couplers 204. Furthermore, while there are two types of quarter wavelength couplers in FIG. 2—the couplers 202 being of one type and the couplers 204 being of another type—there can be as few as one type of coupler and more than two types of couplers.

The quarter wavelength couplers 202 and 204 are each implemented as has been described in relation to the quarter wavelength differential coupler 106. The difference between the quarter wavelength couplers 202 and the quarter wavelength couplers 204 is that the couplers 202 are tuned to one selected frequency at which common mode noise is to be reduced, and the couplers are tuned to a different selected frequency at which common mode noise is to be reduced. That is, the length 114 of each quarter wavelength coupler 202 is identical, and the length 114 of each quarter wavelength coupler 204 is identical. However, the length 114 of each quarter wavelength coupler 202 is different than the length 114 of each quarter wavelength coupler 204.

In operation, the quarter wavelength couplers 202 additively or cumulatively reduce the common mode noise at their corresponding frequency as the differential signal passes through the couplers 202, and similarly the quarter wavelength couplers 204 additively or cumulative reduce the common mode noise at their corresponding (different) frequency as the differential signal passes through the couplers 204. For example, the quarter wavelength couplers 202 may be tuned to a frequency f1, and each coupler 202 may reduce the common mode noise by d1 decibels at this frequency. Similarly, the quarter wavelength couplers 204 may be tuned to a frequency f2, and each coupler 204 may reduce the common mode noise by d2 decibels at this frequency.

Therefore, if the resistors 116 and 118 are present in each quarter wavelength coupler 202 and 204, the common mode noise is reduced by two times d1 at the frequency f1, and by two times d2 at the frequency f2. If the resistors 116 and 118 are removable from the quarter wavelength couplers 202 and 204, the degree or extent to which the common mode noise is reduced can be modified. For example, if the resistors 116 and 118 are removed from just the quarter wavelength coupler 202A, then the common mode noise is reduced by one times d1 at the frequency f1 due to the coupler 202B, and by two times d2 at the frequency f2 due to the two couplers 204. In this example, the quarter wavelength coupler 202A is rendered inoperable in its ability to reduce common mode interference (at its frequency f1), since the resistors 116 and 118 thereof have been removed.

FIG. 3 shows a rudimentary example of an electronic device 300 that can include the differential transmission line 100 (or the differential transmission line 200, although FIG. 3 is described in relation to the transmission line 100) as has been described. The device 300 includes at least a circuit board 302, such as a printed circuit board, as well as one or more electrical components 306. The circuit board 302 is made up of a single-layer or multiple-layer substrate 304, on or within which the conductors 102 and 104 of the transmission line 100 are formed. If the substrate 304 has just one layer, then the transmission line 100 may be formed thereon, whereas if it has multiple layers, then the line 100 may be formed on or within the substrate 304 (such as between two layers). The component 306 is mounted on the circuit board 302, and may be a resistor, capacitor, inductor, integrated circuit (IC), or another type of electrical component. As depicted in the example of FIG. 3, the component 306 is conductively connected to the transmission line 100, but does not have to be in other implementation.

The device 300 includes one or more quarter wavelength differential couplers 308. Each quarter wavelength differential coupler 308 is implemented as has been described in relation to the quarter wavelength differential coupler 106. Different quarter wavelength differential couplers 308 may be tuned to reject the same or different frequencies of common mode noise. The resistors 116 and 118 of each quarter wavelength differential coupler 308 may be removable, so that the extent or degree to which common mode noise at a corresponding frequency is rejected can be changed, adjusted, or modified.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A differential transmission line comprising:
 a positive conductor on which a positive complementary component of a differential signal is transmitted;
 a negative conductor parallel to the positive conductor on which a negative complementary component of the differential signal is transmitted; and
 a quarter wavelength differential coupler inserted along a length of the positive and negative conductors, the quarter wavelength differential coupler having a length corresponding to a frequency of common mode noise on the positive and negative conductors,
 wherein the quarter wavelength differential coupler reduces the common mode noise at the frequency as the differential signal passes through the quarter wavelength differential coupler,
 wherein the quarter wavelength differential coupler is one of a plurality of quarter wavelength differential couplers of the differential transmission line,
 wherein each quarter wavelength differential coupler is placed at a different location along the length of the positive and negative conductors, and has a respective length corresponding to a selected frequency of the common mode noise on the positive and negative conductors,
 wherein the quarter wavelength differential couplers each having a same length additively reduce the common mode noise at the selected frequency as the differential signal passes through the quarter wavelength differential couplers,
 wherein each quarter wavelength differential coupler comprises a coupled line, a first resistor connecting a first end of the coupled line to ground, and a second resistor connecting a second end of the coupled line to ground.

2. The differential transmission line of claim 1, wherein each quarter wavelength differential coupler further comprises:
 a positive main line in electrical series with the positive conductor;
 a negative main line in electrical series with the negative conductor; and
 wherein the coupled line is between and physically parallel to the positive and negative main lines.

3. The differential transmission line of claim 2, wherein the first resistor and the second resistor of each quarter wavelength differential coupler have a same resistance.

4. The differential transmission line of claim 3, wherein each of the first resistor and the second resistor are removable,
 and wherein removal of the first resistor and the second resistor results in each quarter wavelength differential coupler no longer reducing the common mode noise as the differential signal passes through the quarter wavelength differential coupler.

5. The differential transmission line of claim 1, wherein in common mode, each quarter wavelength differential coupler injects an insertion loss to a common mode signal on the positive and negative conductors.

6. The differential transmission line of claim 5, wherein in differential mode, each quarter wavelength differential coupler does not inject an insertion loss to the differential signal on the positive and negative conductors.

7. The differential transmission line of claim 1, wherein the first resistor and the second resistor of each quarter wavelength differential coupler are selectively removable and insertable to adjust a degree to which the common mode noise is reduced at the selected frequencies.

8. A circuit board comprising:
 a substrate;
 a differential transmission line on or within the substrate; and
 a quarter wavelength differential coupler inserted along a length of the differential transmission line to reduce common mode noise as a differential signal is transmitted on the differential transmission line and passes through the quarter wavelength differential coupler,
 wherein the quarter wavelength differential coupler comprises:
 a pair of main lines in series with a pair of conductors of the differential transmission line;
 a coupled line between and physically parallel to the main lines;
 a pair of resistors connecting corresponding ends of the coupled line to ground.

9. The circuit board of claim 8, wherein the quarter wavelength differential coupler has a length equal to a quarter of a wavelength of the common mode noise on the differential transmission line.

10. The circuit board of claim 8, wherein the resistors are removable to turn off common mode noise reduction of the quarter wavelength differential coupler.

11. The circuit board of claim 8, wherein in common mode the quarter wavelength differential coupler injects an insertion loss to a common mode signal on the differential transmission line, and wherein in differential mode the quarter wavelength differential coupler does not inject an insertion loss to the differential signal on the differential transmission line.

12. An electronic device comprising:
a circuit board;
one or more electrical components mounted on or within the circuit board;
a differential transmission line formed on or within the circuit board to transmit a differential signal; and
a plurality of quarter wavelength differential couplers, each quarter wavelength differential coupler inserted at a different location along a length of the differential transmission line,
wherein the plurality of quarter wavelength differential couplers additively reduce common mode noise at a selected frequency as the differential signal is transmitted on the differential transmission line and passes through each quarter wavelength differential coupler,
and wherein each quarter wavelength differential coupler comprises a pair of main lines in series with a pair of conductors of the differential transmission line, a coupled line between and physically parallel to the main lines, and a pair of resistors connecting corresponding ends of the coupled line to ground.

13. The electronic device of claim 12, wherein each quarter wavelength differential coupler has a respective length equal to a quarter of a selected wavelength of the common mode noise on the differential transmission line.

14. The electronic device of claim 12, wherein the quarter wavelength differential couplers are first quarter wavelength differential couplers, the selected frequency is a first selected frequency of the common mode noise, and the electronic device further comprises:
a plurality of second quarter wavelength differential couplers, each second quarter wavelength differential coupler inserted at a different location along the length of the differential transmission line,
wherein the second quarter wavelength differential couplers additively reduce the common mode noise at a second selected frequency different from the first selected frequency as the differential signal is transmitted on the differential transmission line and passes through each quarter wavelength differential coupler.

15. The electronic device of claim 12, wherein the quarter wavelength differential couplers inject an insertion loss to a common mode signal on the differential transmission line,
and wherein the quarter wavelength differential couplers do not inject an insertion loss to the differential signal on the differential transmission line.

\* \* \* \* \*